(12) United States Patent
Sugimoto (10) Patent No.: US 11,956,951 B2
(45) Date of Patent: Apr. 9, 2024

(54) SEMICONDUCTOR INTEGRATED CIRCUIT (71) Applicant: Kioxia Corporation, Tokyo (JP)

(72) Inventor: Takahiro Sugimoto, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 136 days.

(21) Appl. No.: 17/839,038

(22) Filed: Jun. 13, 2022

(65) Prior Publication Data

US 2023/0292503 A1    Sep. 14, 2023

(30) Foreign Application Priority Data

Mar. 8, 2022  (JP) .................................. 2022-035095

(51) Int. Cl.
  *G11C 16/30*  (2006.01)
  *G11C 5/14*  (2006.01)
  *G11C 11/413*  (2006.01)
  *G11C 16/32*  (2006.01)
  *H10B 41/41*  (2023.01)

(52) U.S. Cl.
  CPC ............ *H10B 41/41* (2023.02); *G11C 16/30* (2013.01); *G11C 16/32* (2013.01); *G11C 5/14* (2013.01); *G11C 11/413* (2013.01)

(58) Field of Classification Search
  CPC .......... G11C 16/30; G11C 5/14; G11C 11/413
  USPC .................................................... 365/185.24
  See application file for complete search history.

(56) References Cited

U.S. PATENT DOCUMENTS

| 5,637,900 | A | 6/1997 | Ker et al. |
| 6,351,172 | B1* | 2/2002 | Ouyang ........... H03K 19/00384 327/333 |
| 7,969,181 | B1* | 6/2011 | Fefer .................. H03K 19/0005 326/86 |
| 9,910,482 | B2* | 3/2018 | Brunolli ............. H04L 25/0264 |
| 2017/0324240 | A1 | 11/2017 | Cheng et al. |
| 2018/0005964 | A1 | 1/2018 | Ordas et al. |
| 2020/0203335 | A1 | 6/2020 | Park et al. |

FOREIGN PATENT DOCUMENTS

| JP | H08221977 A | 8/1996 |
| TW | 202205774 A | 2/2022 |

* cited by examiner

*Primary Examiner* — Connie C Yoha
(74) *Attorney, Agent, or Firm* — Holtz, Holtz & Volek PC (57) ABSTRACT

According to one embodiment, a semiconductor integrated circuit includes a first circuit that includes a level shift transistor, a transmission line through which the signal output from the first circuit propagates, a second circuit that is connected the transmission line to receive the signal propagating through the transmission line, and a third circuit that is connected to the transmission line. The first circuit is connected to a power supply line to which a first voltage is supplied, and outputs, to the transmission line, a signal having an amplitude lower than the first voltage by a threshold voltage of the level shift transistor. The third circuit allows a current to flow from the transmission line when a voltage of the transmission line exceeds a set voltage.

19 Claims, 10 Drawing Sheets

SEMICONDUCTOR INTEGRATED CIRCUIT

CROSS-REFERENCE TO RELATED APPLICATIONS

This application is based upon and claims the benefit of priority from prior Japanese Patent Application P2022-035095 filed on Mar. 8, 2022; the entire contents of which are incorporated by reference herein.

FIELD

Embodiments described herein relate generally to a semiconductor integrated circuit.

BACKGROUND

In a semiconductor integrated circuit, circuit blocks arranged on a substrate are connected to each other by means of signal lines. The transition of data between a high level and a low level is repeated in a signal line (hereinafter also referred to as a "transmission line") through which data input to a circuit block and data output from a circuit block propagate. Therefore, the current consumption of the transmission line due to the charge/discharge of electric charge is large.

DETAILED DESCRIPTION

According to one embodiment, a semiconductor integrated circuit includes a first circuit that includes a level shift transistor, a transmission line through which a signal output from the first circuit propagates, a second circuit that is connected the transmission line to receive the signal propagating through the transmission line, and a third circuit that is connected to the transmission line. The first circuit is connected to a power supply line to which a first voltage is supplied, and outputs, to the transmission line, a signal having an amplitude lower than the first voltage by a threshold voltage of the level shift transistor. The third circuit allows a current to flow from the transmission line when a voltage of the transmission line exceeds a set voltage.

Next, embodiments will be described with reference to the drawings. In the drawings described below, the same or similar parts are denoted by the same or similar reference numerals. The drawings are schematic. Further, the following embodiments exemplify devices and methods for embodying technical ideas, and do not specify materials, shapes, structures, arrangements, and the like of parts. Embodiments may be modified in various ways.

First Embodiment

Figure 1:
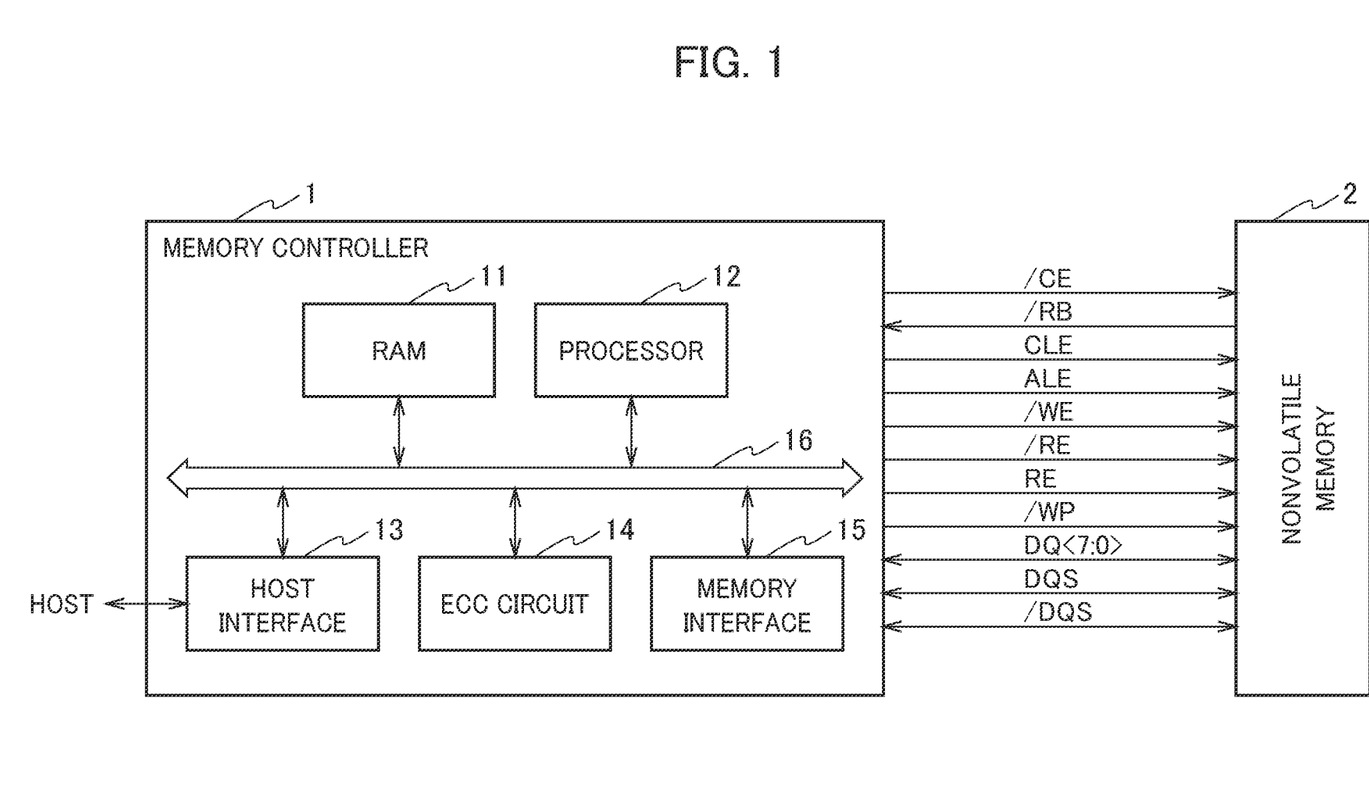
FIG. 1 is a block diagram showing a configuration of a memory system that includes a nonvolatile memory having a semiconductor integrated circuit according to a first embodiment.

A semiconductor integrated circuit according to a first embodiment of the present invention can be applied to a nonvolatile memory 2 included in a memory system shown in FIG. 1, for example. The nonvolatile memory 2 is a semiconductor memory that stores data in a nonvolatile manner. The nonvolatile memory 2 includes a NAND flash memory, for example. A memory controller 1 controls the operation of the nonvolatile memory 2. The host is an electronic device such as a personal computer or a mobile terminal, for example.

First, the memory system shown in FIG. 1 will be described. In the following description, "signal DQ<7:0>" refers to a gathering of signals DQ<0>, DQ<1>, ... DQ<7>, each of which is a signal of one bit. The signal DQ<7:0> is a signal of eight bits.

The memory controller 1 receives a command from the host and controls the nonvolatile memory 2 based on the received command. Specifically, the memory controller 1 writes, in the nonvolatile memory 2, data which is instructed by the host to be written in the memory. The memory controller 1 reads, from the nonvolatile memory 2, data which is instructed by the host to be read from the memory, and transmits the data to the host. A write target nonvolatile memory cell in the nonvolatile memory 2 is assigned by the memory controller 1. The nonvolatile memory cell in the nonvolatile memory 2 is also referred to below as a "memory cell".

The memory controller 1 and the nonvolatile memory 2 transmit/receive signals in accordance with interface standards between the memory controller 1 and the nonvolatile memory 2 via individual signal lines. Signals transmitted/received between the memory controller 1 and the nonvolatile memory 2 are signals /CE, /RB, CLE, ALE, /WE, /RE, RE, /WP, DQ<7:0>, DQS, /DQS, and the like.

The signal /CE is a chip enable signal for enabling the nonvolatile memory 2. The signal /RB is a ready/busy signal indicating whether the nonvolatile memory 2 is in a ready state (a state of accepting an external command) or in a busy state (a state of not accepting an external command). The signal CLE is a command latch enable signal that notifies the nonvolatile memory 2 of information that the signal DQ<7:0> transmitted to the nonvolatile memory 2 is a command when the signal CLE is at a high (H) level. The signal ALE is an address latch enable signal that notifies the nonvolatile memory 2 of information that the signal DQ<7:0> transmitted to the nonvolatile memory 2 is an address when the signal ALE is at the H level. The signal /WE is a write enable signal that instructs the nonvolatile memory 2 to load the signal DQ<7:0> transmitted to the nonvolatile memory 2. In a single data rate (SDR) mode, the signal /WE instructs the nonvolatile memory 2 to load the signal DQ<7:0> as a command, an address, or data transmitted to the nonvolatile memory 2 at a rising edge of the signal /WE. The signal /WE also instructs the nonvolatile memory 2 to load the signal DQ<7:0> as a command or an address transmitted to the nonvolatile memory 2 at the rising edge of the signal /WE in a double data rate (DDR) mode. The signal /WE is asserted each time the nonvolatile memory 2 receives a command, address, and data from the memory controller 1.

The signal /RE is a read enable signal that instructs the memory controller 1 to read the signal DQ<7:0> from the nonvolatile memory 2. The signal RE is a complementary signal of the signal /RE. The signals /RE and RE are used for controlling a timing at which the nonvolatile memory 2 outputs the signal DQ<7:0>, for example. More specifically, the signal /RE instructs the nonvolatile memory 2 to output the signal DQ<7:0> as data at a falling edge of the signal /RE in the single data rate mode. The signal /RE also instructs the nonvolatile memory 2 to output the signal DQ<7:0> as data at the falling edge and the rising edge of the signal /RE in the double data rate mode. The signal /WP is a write protect signal that instructs the nonvolatile memory 2 to write-protect data. The signal DQ<7:0> is an entity of data transmitted/received between the nonvolatile memory 2 and the memory controller 1, and includes a command CMD, an address ADD, and data DAT. The data DAT includes write data and readout data. The signal DQS is a data strobe signal used for controlling the operating timing of the nonvolatile memory 2 regarding the signal DQ<7:0>. The signal /DQS is a complementary signal of the signal DQS. The signals DQS and /DQS are generated based on the signals RE and /RE, for example. More specifically, the signal DQS instructs the nonvolatile memory 2 to load the signal DQ<7:0> as data at the falling edge and the rising edge of the signal DQS in the double data rate mode. The signal DQS is generated in accordance with the falling edge and the rising edge of the signal /RE in the double data rate mode, and is output together with the signal DQ<7:0> as data from the nonvolatile memory 2.

The memory controller 1 includes a RAM 11, a processor 12, a host interface 13, an ECC circuit 14, and a memory interface 15. The RAM 11, the processor 12, the host interface 13, the ECC circuit 14, and the memory interface 15 are connected to one another via a bus 16.

The RAM 11 temporarily stores data received from the host until the data is stored in the nonvolatile memory 2, or temporarily stores data read from the nonvolatile memory 2 until the data is transmitted to the host. The RAM 11 is a general-purpose semiconductor memory such as a static random access memory (SRAM) or a dynamic random access memory (DRAM).

The processor 12 controls the entire operation of the memory controller 1. The processor 12 is a processing unit such as a central processing unit (CPU) and a microprocessing unit (MPU), for example. The processor 12 responds to a command to read out data received from the host, and issues the readout command to the nonvolatile memory 2, for example. This operation is also applied to when data is written. The processor 12 determines a storage region (a memory region) in the nonvolatile memory 2 for data accumulated in the RAM 11. The processor 12 also has a function of executing various kinds of mathematical operations for the data read from the nonvolatile memory 2.

The host interface 13 is connected to the host and performs processing in accordance with interface standards between the host and the host interface 13. The host interface 13 transfers the command and the data received from the host to the processor 12, for example. The host interface 13 also transmits, to the host, the data read from the nonvolatile memory 2, the response from the processor 12, and the like.

The ECC circuit 14 encodes the data stored in the RAM 11 to generate code words. Further, the ECC circuit 14 decodes code words read from the nonvolatile memory 2.

The memory interface 15 is connected to the nonvolatile memory 2 via a bus to establish communications with the nonvolatile memory 2. The memory interface 15 transmits, to the nonvolatile memory 2, the command CMD, the address ADD, and the write data in accordance with a command received from the processor 12. The memory interface 15 also receives readout data from the nonvolatile memory 2.

FIG. 1 shows a configuration example in which the memory controller 1 includes both of the ECC circuit 14 and the memory interface 15. However, the ECC circuit 14 may be housed in the memory interface 15. Further, the ECC circuit 14 may be housed in the nonvolatile memory 2.

If the memory system receives a write command from the host, the memory system operates as follows. The processor 12 temporarily stores the data which is instructed to be written in the RAM 11. The processor 12 reads out the data stored in the RAM 11 and inputs the data to the ECC circuit 14. The ECC circuit 14 encodes the input data and inputs the code word to the memory interface 15. The memory interface 15 writes the input code word in the nonvolatile memory 2.

If the memory system receives a readout command from the host, the memory system operates as follows. The memory interface 15 inputs, to the ECC circuit 14, the code word read from the nonvolatile memory 2. The ECC circuit 14 decodes the input code word and stores the decoded data in the RAM 11. The processor 12 transmits the data stored in the RAM 11 to the host via the host interface 13.

Figure 2:
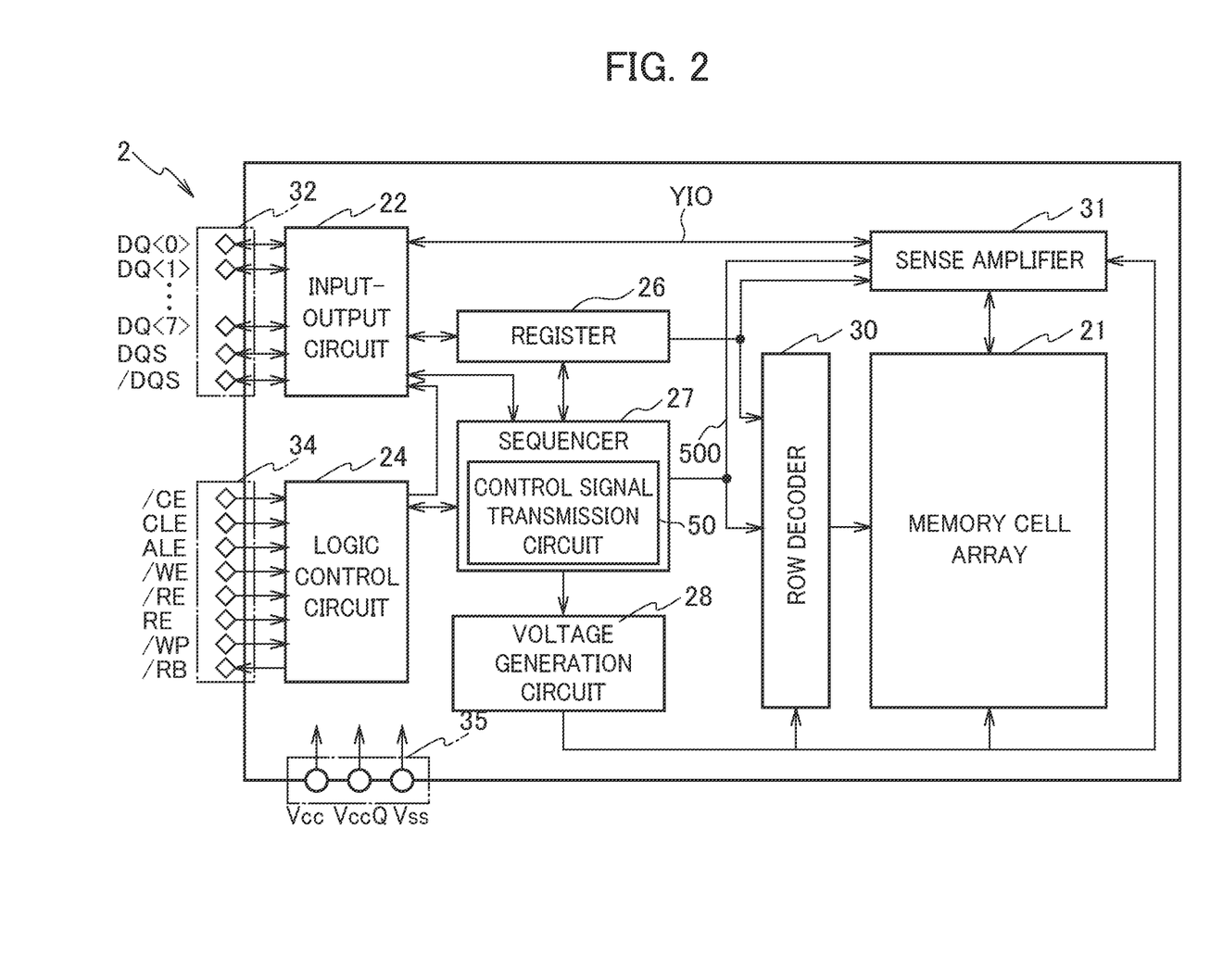
FIG. 2 is a block diagram showing a configuration of a nonvolatile memory having a semiconductor integrated circuit according to a first embodiment.

FIG. 2 is a block diagram showing a configuration example of the nonvolatile memory 2. The nonvolatile memory 2 includes a memory cell array 21, an input-output circuit 22, a logic control circuit 24, a register 26, a sequencer 27, a voltage generation circuit 28, a row decoder 30, and a sense amplifier 31. The nonvolatile memory 2 further includes a pad group for input/output 32, a pad group for logic control 34, and a terminal group for power supply input 35.

The memory cell array 21 includes a plurality of memory cells (not shown) associated with word lines and bit lines.

The input-output circuit 22 transmits/receives the signal DQ<7:0>, the signal DQS, and the signal /DQS to/from the memory controller 1. The input-output circuit 22 transfers, to the register 26, the command CMD and the address ADD in the signal DQ<7:0>. Further, the input-output circuit 22 transmits/receives write data and readout data to/from the sense amplifier 31. The logic control circuit 24 receives, from the memory controller 1, the signals /CE, CLE, ALE, /WE, /RE, RE, /WP, and /RB. The logic control circuit 24 transfers the signal /RB to the memory controller 1 and externally notifies the state of the nonvolatile memory 2.

The register 26 temporarily stores the command CMD and the address ADD. The register 26 transfers the address ADD to the row decoder 30 and the sense amplifier 31, and transfers the command CMD to the sequencer 27.

The sequencer 27 receives the command CMD and controls the entire nonvolatile memory 2 in accordance with a sequence based on the received command CMD. The sequencer 27 supplies control signals to the row decoder 30 and the sense amplifier 31 via the signal line 500, for example. The number of signal lines 500 in the memory may be two or more, for example. In this case, a plurality of kinds of control signals are supplied from the sequencer 27 to the row decoder 30 and/or the sense amplifier 31 via a plurality of signal lines 500, respectively.

The voltage generation circuit 28 generates a voltage necessary for operations, such as the writing of data, readout of data, and deletion of data in accordance with an instruction from the sequencer 27. Various types of voltages are supplied from the voltage generation circuit 28 to the row decoder 30, the sense amplifier 31, and the memory cell array 21 based on the address from the register 26.

The row decoder 30 receives, from the register 26, a block address and a row address in the address ADD. The row decoder 30 selects a block based on the block address and selects a word line based on the row address.

When data is read out, the sense amplifier 31 senses the readout data read from the memory cell to the bit line. Then, the sense amplifier 31 transfers the sensed readout data to the input-output circuit 22. When data is written, the sense amplifier 31 transfers the write data to the memory cell via the bit line.

The data is transferred between the sense amplifier 31 and the input-output circuit 22 via a data bus YIO. The data bus YIO includes a plurality of transmission lines. The data written in the nonvolatile memory 2 and the data read from the nonvolatile memory 2 propagate through the data bus YIO.

The pad group for input/output 32 includes a plurality of terminals (pads) corresponding to the signal DQ<7:0> and the signals DQS and /DQS in order to transmit/receive each signal including data between the nonvolatile memory 2 and the memory controller 1.

The pad group for logic control 34 includes a plurality of terminals (pads) corresponding to the signals /CE, CLE, ALE, /WE, /RE, RE, /WP, and /RB in order to transmit/receive each signal between the nonvolatile memory 2 and the memory controller 1.

The terminal group for power supply input 35 includes a plurality of terminals to which power supply voltages Vcc and VccQ and a ground voltage VSS are input in order to supply various types of operating power sources to the nonvolatile memory 2 from the outside. The power supply voltage Vcc is a circuit power supply voltage which is generally supplied from the outside as an operating power source. The power supply voltage Vcc is 2.5 V, for example. The power supply voltage VccQ is used when a signal is transmitted/received between the memory controller 1 and the nonvolatile memory 2. The power supply voltage VccQ is 1.2 V, for example.

Figure 3A:
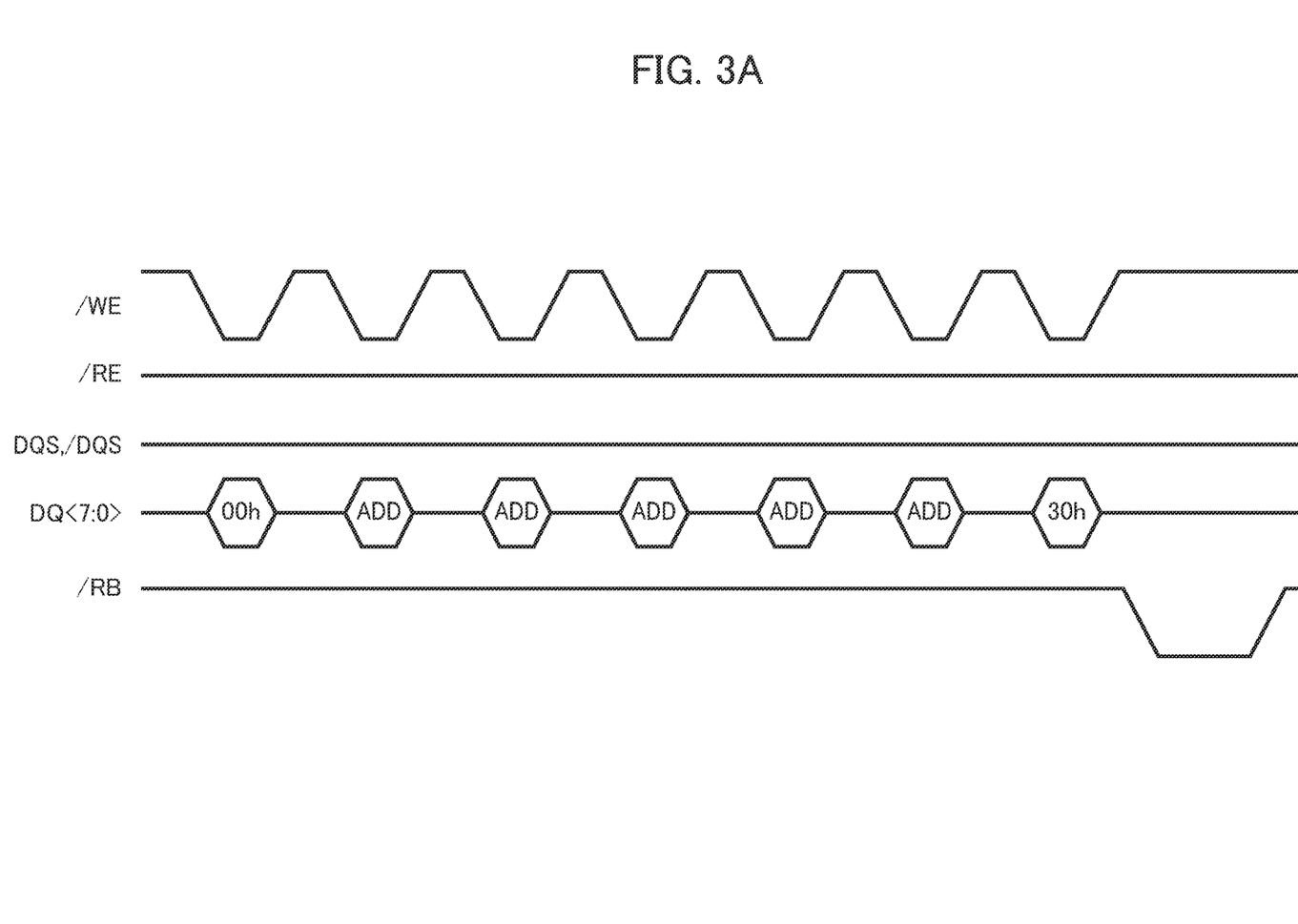
FIG. 3A is an example of a command sequence for instructing a readout operation of a nonvolatile memory.

FIG. 3A shows an example of a command sequence for instructing a readout operation of the nonvolatile memory 2.

Figure 3B:
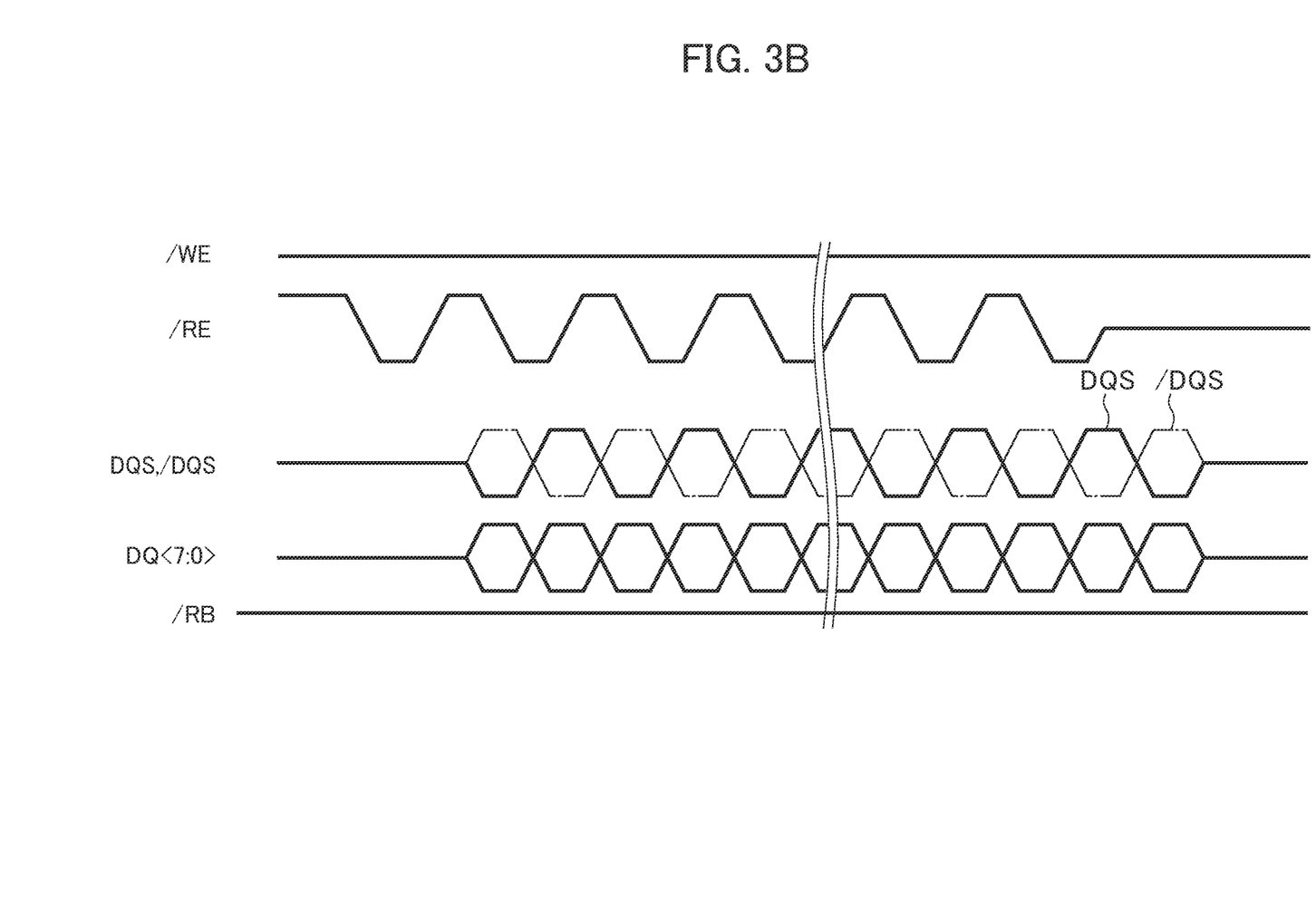
FIG. 3B is an example of a command sequence regarding an operation for reading out data from a nonvolatile memory.

FIG. 3B shows an example of a command sequence regarding an operation of reading out data from the nonvolatile memory 2.

As shown in FIG. 3A, the memory controller 1 issues a command set for instructing the readout operation to the nonvolatile memory 2 while toggling the signal /WE at the time of the readout operation. The command set for instructing the readout operation includes a readout command "00h", addresses ADD for five cycles, and a command "30h", for example. The readout command "00h" is a command for commanding the nonvolatile memory 2 to read the data from the memory cell array 21. The command "30h" is a command for commanding the start of the readout operation. After receiving the command "30h", the nonvolatile memory 2 starts the operation of reading data from the memory cell array 21. The nonvolatile memory 2 sets the signal /RB to the L level, and notifies the memory controller 1 that the nonvolatile memory 2 is in the busy state. After the completion of the readout of the data from the memory cell array 21, the nonvolatile memory 2 sets the signal /RB to the H level and notifies the memory controller 1 that the nonvolatile memory 2 is in the ready state.

After confirming that the nonvolatile memory 2 is in the ready state, the memory controller 1 toggles the signals /RE and RE as shown in FIG. 3B. The nonvolatile memory 2 transfers, to the memory controller 1, the read data synchronized with the signals /RE and RE as the signal DQ<7:0>. The nonvolatile memory 2 toggles the signals DQS and /DQS synchronized with the signal DQ<7:0> and transfers the signals to the memory controller 1.

After confirming that the nonvolatile memory 2 is in the ready state, the memory controller 1 may issue, to the nonvolatile memory 2, a command set for instructing a data-out operation while toggling the signal /WE. The command set for instructing the data-out operation includes a data-out command "05h", addresses ADD for five cycles, and a command "E0h", for example. In this case, after an elapse of a predetermined period from when the command "E0h" is transmitted to the nonvolatile memory 2, the memory controller 1 toggles the signals /RE and RE. The nonvolatile memory 2 transfers, to the memory controller 1, the read data synchronized with the signals /RE and RE as the signal DQ<7:0>. The nonvolatile memory 2 toggles the signals DQS and /DQS synchronized with the signal DQ<7:0> and transfers the signal to the memory controller 1.

Figure 4:
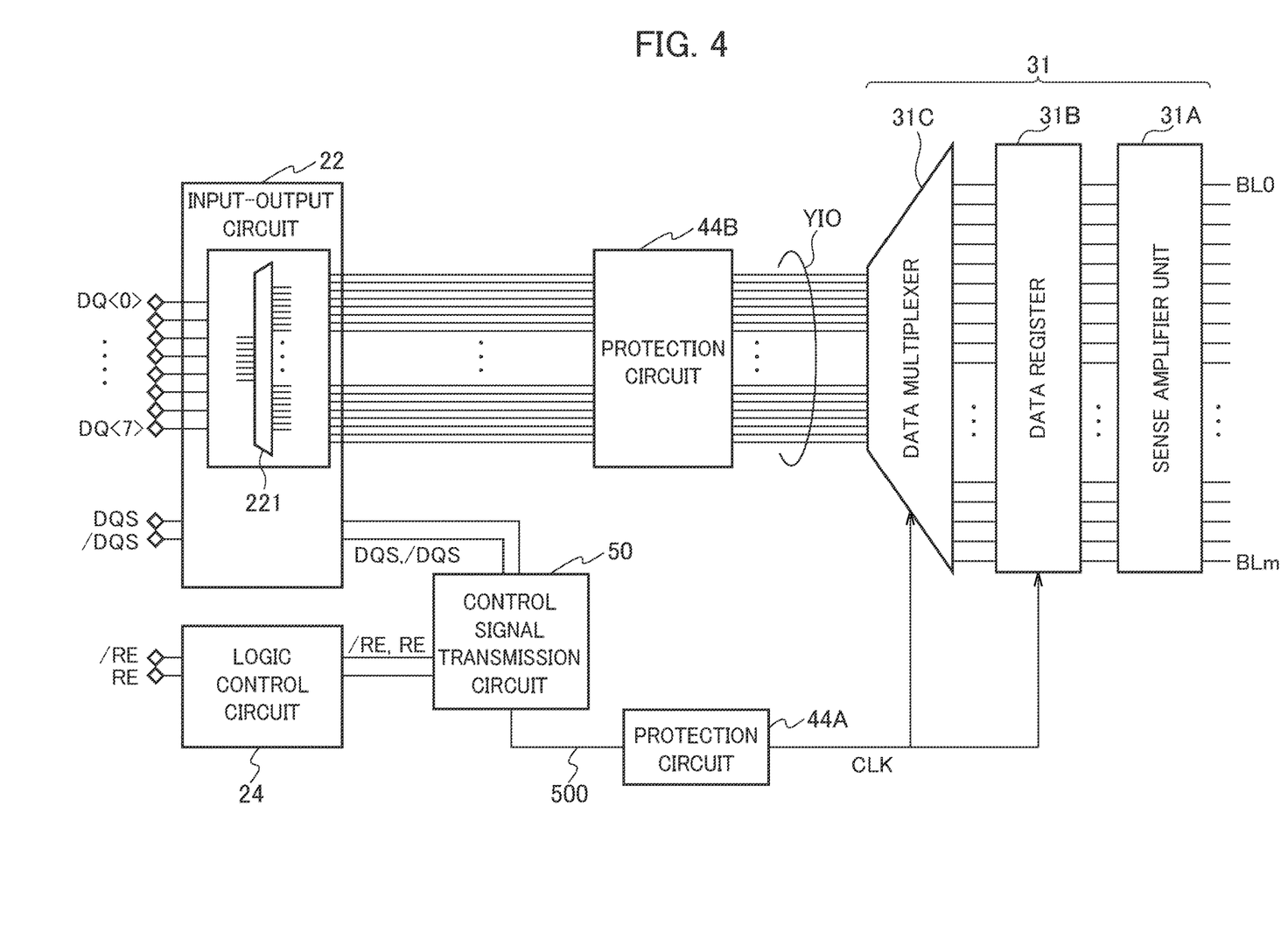
FIG. 4 is a block diagram showing a part of a configuration of a nonvolatile memory having a semiconductor integrated circuit according to a first embodiment.

FIG. 4 is a block diagram showing a part of the configuration of the nonvolatile memory 2. More specifically, FIG. 4 is a block diagram showing a portion in the nonvolatile memory 2 to which a small-amplitude transmission circuit of the present embodiment is applied.

The input-output circuit 22 transmits/receives write data and readout data to/from the sense amplifier 31 via the data bus YIO.

The sense amplifier 31 has a sense amplifier unit 31A connected to bit lines BL0 to BLm, a data register 31B connected to the sense amplifier unit 31A, and a data multiplexer 31C connected to the data register 31B. The number of the bit lines is about 130 thousand, for example. The sense amplifier unit 31A senses the readout data read to the bit lines and transfers the write data to memory cells via the bit lines. The data register 31B stores the readout data and the write data. The data multiplexer 31C selects data propagated through signal lines forming the data bus YIO from data propagated through the bit lines BL0 to BLm. The number of the signal lines forming the data bus YIO is 128, for example.

The input-output circuit 22 may include a conversion circuit 221 that changes a bus width. The conversion circuit 221 changes the bus width of the data bus YIO including 128 bit lines, for example, so that the bus has eight signal lines through which the signal DQ<7:0> is propagated. The conversion circuit 221 may be a first-in first-out (FIFO) circuit, for example. The power supply voltage Vcc (2.5 V, for example) is applied between the sense amplifier 31 and the conversion circuit 221 for operation therebetween. The power supply voltage VccQ (1.2 V, for example) is applied between the conversion circuit 221 and the memory controller 1 for operation therebetween.

A control signal transmission circuit 50 is a part of the sequencer 27 shown in FIG. 2, for example. The control signal transmission circuit 50 generates a clock signal CLK based on the signals /RE and RE supplied from the memory controller 1 during the data-out operation, for example.

As shown in FIG. 4, a protection circuit 44A is connected to the signal line 500. The signal line 500 is used for transmitting the clock signal CLK from the control signal transmission circuit 50 to the data register 31B and the data multiplexer 31C. A protection circuit 44B is connected to the data bus YIO. The data bus YIO is used for transmitting/receiving write data and readout data between the input-output circuit 22 and the sense amplifier 31. FIG. 2 shows the control signal transmission circuit 50 as a part of the sequencer 27. However, the control signal transmission circuit 50 may be configured as a part of the input-output circuit 22 and/or the logic control circuit 24, for example. Further, the control signal transmission circuit 50 may be configured as a circuit different from any of the sequencer 27, the input-output circuit 22, and the logic control circuit 24.

Figure 5:
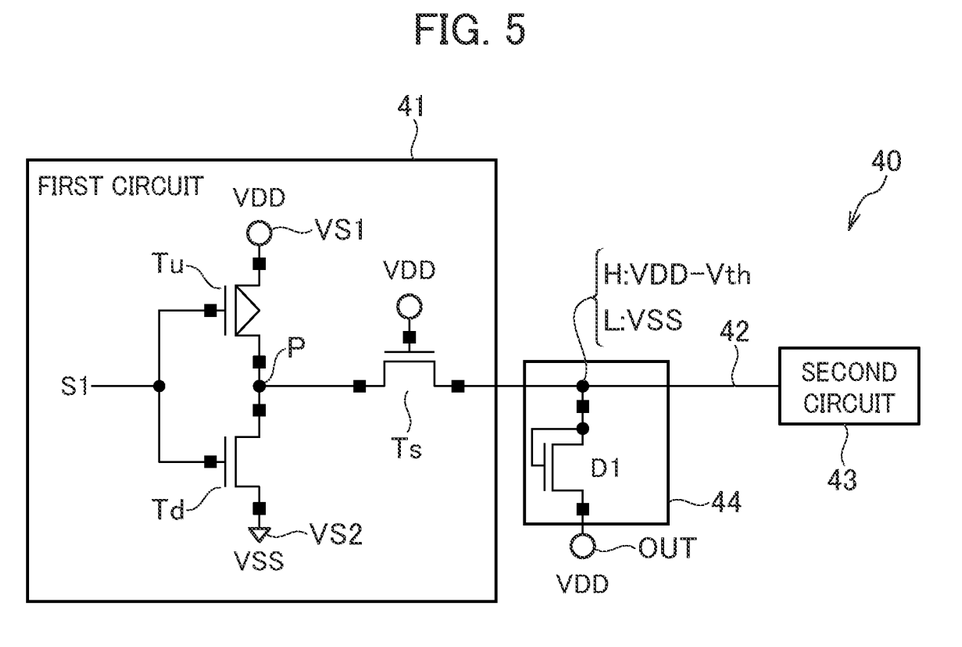
FIG. 5 is a circuit diagram showing a configuration of a semiconductor integrated circuit according to a first embodiment.

The details of a small-amplitude transmission circuit 40 in the semiconductor integrated circuit according to the first embodiment will be described below. As shown in FIG. 5, the small-amplitude transmission circuit 40 in the semiconductor integrated circuit according to the first embodiment includes a first circuit 41, a transmission line 42, a second circuit 43, and a protection circuit 44 (a third circuit). The first circuit 41 functions as a "driver circuit" and the second circuit 43 functions as a "receiver circuit". The driver circuit for transmitting a control signal included in the control signal transmission circuit 50 (the fourth circuit) shown in FIG. 4 corresponds to the first circuit 41, for example. The control signal transmission circuit 50 generates a clock signal. The receiver circuit for receiving a control signal included in the data register 31B and/or the data multiplexer 31C shown in FIG. 4 corresponds to the second circuit 43. In this case, the signal line 500 used for transmitting a control signal shown in FIG. 4 corresponds to the transmission line 42, and the protection circuit 44A shown in FIG. 4 corresponds to the protection circuit 44. The transmission line 42 includes a clock line that extends from the control signal transmission circuit 50 to the sense amplifier 31 and through which the clock signal propagates.

The first circuit 41 is connected between a power supply line VS1 (a first power supply line) and a power supply line VS2 (a second power supply line). The first circuit 41 has a level shift transistor Ts. The level shift transistor Ts outputs an output signal having a voltage dropped by its own threshold voltage based on an input signal, as described later. The first circuit 41 is connected to a first power supply line to which a first voltage is supplied, and outputs a signal having an amplitude of a voltage which is lower than the first voltage by a voltage corresponding to the threshold voltage of the level shift transistor Ts. The first circuit 41 shown in FIG. 5 outputs a signal having a voltage which is set to a high level. The voltage output by the first circuit 41 is obtained by dropping the voltage VDD (the first voltage) of a power supply line VS1 (the first power supply line) by a voltage corresponding to a threshold voltage Vth of the level shift transistor Ts. Data output from the first circuit 41 propagates through the transmission line 42. The second circuit 43 is connected the transmission line 42 to receive the signal propagating through the transmission line 42. That is, the data propagated through the transmission line 42 is input to the second circuit 43. The protection circuit 44 is connected to the transmission line 42, and if the voltage of the transmission line 42 exceeds a predetermined set voltage, a current flows from the transmission line 42. The protection circuit 44 shown in FIG. 5 is connected between the transmission line 42 and an output terminal OUT of a third power supply line to which a third voltage higher than the second voltage is supplied. For example, a voltage equal to the voltage VDD of the power supply line VS1 is supplied to the output terminal OUT. If the voltage of the transmission line 42 exceeds the set voltage, the protection circuit 44 allows a current to flow from the transmission line 42 to the output terminal OUT. The set voltage is higher than the voltage VDD. More specifically, the set voltage is higher than the voltage VDD by the voltage drop caused by a diode D1 included in the protection circuit 44.

In the semiconductor integrated circuit shown in FIG. 5, a voltage obtained by dropping, from the voltage VDD of the power supply line VS1, by a voltage corresponding to the threshold voltage Vth of the level shift transistor Ts is used as the voltage of the transmission line 42. By dropping the voltage of the transmission line 42, the amplitude of a signal propagated through the transmission line 42 is reduced. Hereinafter, the semiconductor integrated circuit shown in FIG. 5 is also referred to as a "small-amplitude transmission circuit 40". In general, a signal propagated through a signal line repeats a transition between a high level and a low level. The larger the amplitude of the signal, the larger the current consumption when repeating the transition between the high level and the low level. According to the small-amplitude transmission circuit 40 of the present embodiment, it is possible to suppress the amplitude of a signal propagating through the transmission line 42. Therefore, the current consumption of the transmission line 42 caused by charge/discharge of electric charges due to repeated transition of the signal between a high level and a low level is reduced.

An n-channel type MOSFET (metal-oxide-semiconductor field effect transistor) may be used as the level shift transistor Ts of the first circuit 41 as shown in FIG. 5, for example. Hereinafter, an re-channel type MOS transistor is also referred to as an "NMOS transistor". In the following description, the case where the level shift transistor Ts is an NMOS transistor will be described by way of example.

In the first circuit 41, a signal S1 is input to a driver of a CMOS (Complementary MOS) structure in which a pull-up transistor Tu and a pull-down transistor Td are cascade-connected. The cascade-connected pull-up transistor Tu and pull-down transistor Td function as a CMOS driver. The pull-up transistor Tu is a p-channel type MOS transistor, and the pull-down transistor Td is an NMOS transistor, for example. Hereinafter, the p-channel type MOS transistor is also referred to as a "PMOS transistor". The source electrode of the pull-up transistor Tu is connected to a high-voltage power supply line VS1, and the drain electrode of the pull-up transistor Tu is connected to the drain electrode of the pull-down transistor Td at a connection point P. The source electrode of the pull-down transistor Td is connected to a low-voltage power supply line VS2.

The voltage VDD of the power supply line VS1 may be generated from the power supply voltage Vcc, for example. The voltage VDD is 2 V, for example. The voltage VSS (a second voltage lower than the first voltage) of the power supply line VS2 (the second power supply line) is a ground voltage, for example. The high level of the signal at the connection point P is the voltage VDD, and the low level of the signal is the voltage VSS. That is, an amplitude (hereinafter referred to as a "first amplitude") of the signal at the connection point P is "VDD-VSS". Hereinafter, the case where VDD=2V and VSS=0V will be described by way of example.

The level shift transistor Ts is connected between the connection point P and the transmission line 42. The connection point P serves as an output terminal of the CMOS driver having the pull-up transistor Tu and the pull-down transistor Td. That is, a first main electrode of the level shift transistor Ts is connected to the connection point P, and a second main electrode of the level shift transistor Ts is connected to the transmission line 42. The voltage VDD is supplied to a gate electrode of the level shift transistor Ts. The voltage of the second main electrode of the level shift transistor Ts is lower than the voltage of the first main electrode by a voltage corresponding to the threshold voltage of the level shift transistor Ts. Specifically, the voltage of the high level signal propagated through the transmission line 42 is a voltage obtained by lowering, from the voltage VDD, by a voltage corresponding to the threshold voltage Vth of the level shift transistor Ts. Therefore, an amplitude of a signal propagated through the transmission line 42 (hereinafter referred to as a "second amplitude") is "VDD-Vth-VSS". If VSS is 0 V, the amplitude of the signal propagated through the transmission line 42 is "VDD-Vth".

The first circuit 41 having the above configuration outputs the signal S1 input with the first amplitude, to the transmission line 42 with a second amplitude smaller than the first amplitude. That is, in the small-amplitude transmission circuit shown in FIG. 5, the level shift transistor Ts reduces the amplitude of the signal propagating through the transmission line 42. Accordingly, it is possible to reduce the current consumption due to the transition of the signal propagating through the transmission line 42 between the high level and the low level. Suppose that the voltage VDD is 2 V, the voltage VSS is 0 V, and the threshold voltage Vth of the level shift transistor Ts is 1 V, for example. In the above case, the high level signal output from the pull-up transistor Tu has a voltage which is decreased from 2 V to 1 V, and then is output to the transmission line 42. In other words, the level shift transistor Ts changes a signal with a first amplitude (2 V, for example) to a signal with a second amplitude (1 V, for example).

Incidentally, there is a risk that the voltage of the transmission line 42 may fluctuate due to the influence of a circuit arranged in the periphery of the transmission line 42. Hereinafter, a circuit which affects the voltage of the transmission line 42 is also referred to as an "aggressor circuit". Due to the influence of capacitive coupling between the transmission line 42 and an aggressor circuit, the voltage of the transmission line 42 may rise above the voltage VDD. If the voltage of the transmission line 42 rises above the voltage VDD, there is a concern that the voltage may exceed the breakdown voltage limit of an element connected to the transmission line 42.

Figure 6:
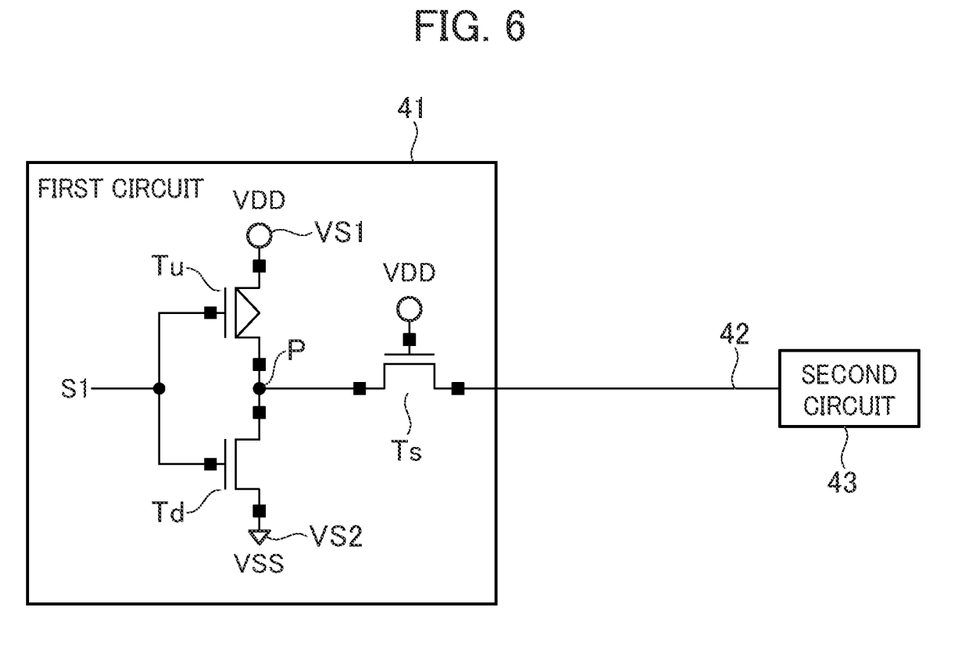
FIG. 6 is a circuit diagram showing a configuration of a semiconductor integrated circuit according to a comparative example.

FIG. 6 shows a small-amplitude transmission circuit of a comparative example without the protection circuit 44. In the small-amplitude transmission circuit of the comparative example shown in FIG. 6 also, as in the small-amplitude transmission circuit 40 shown in FIG. 5, a signal having a voltage whose level is lowered from a high level by the level shift transistor Ts propagates through the transmission line 42.

Figure 7:
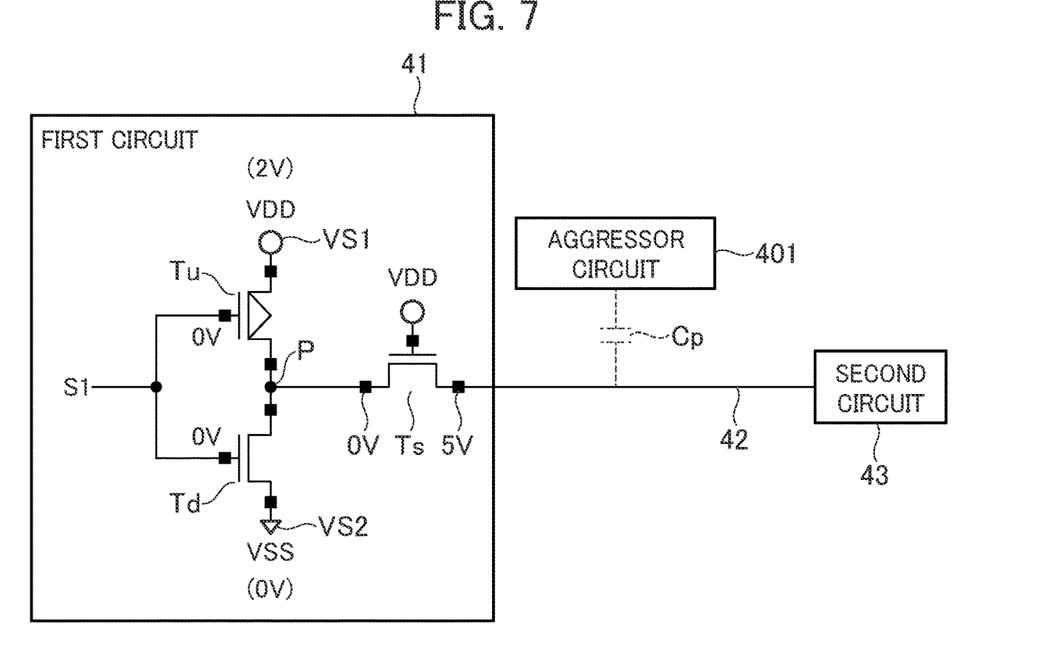
FIG. 7 is a schematic diagram showing an example of how an aggressor circuit is arranged.

Here, a case is considered in which an aggressor circuit 401 (fifth circuit) is disposed in the periphery of the transmission line 42 of the small-amplitude transmission circuit of the comparative example as shown in FIG. 7. The transmission line 42 of the small-amplitude transmission circuit of the comparative example and the aggressor circuit 401 are capacitively coupled by means of a parasitic capacitance Cp. If it is assumed that the aggressor circuit 401 is operated at a power supply voltage of 5 V, there is a concern that the voltage of the transmission line 42 may exceed 5 V, for example. If the voltage of the transmission line 42 rises, there is a risk that an element connected to the transmission line 42 may break due to a voltage exceeding the breakdown voltage limit of the element being applied to the element.

Assume that the gate electrodes of both the pull-up transistor Tu and the pull-down transistor Td are set to 0 V (low level) while the voltage of the transmission line 42 exceeds 5 V as described above, for example. In the above case, the voltage of the first main electrode of the level shift transistor Ts connected to the connection point P is 2 V. Meanwhile, the voltage of the second main electrode of the level shift transistor Ts connected to the transmission line 42 whose voltage exceeds 5 V due to the influence of the aggressor circuit 401 is 5 V. Therefore, a voltage difference of 3 V is generated between the main electrodes of the level shift transistor Ts, and the level shift transistor Ts may break due to a voltage exceeding the breakdown voltage limit of the level shift transistor Ts being applied to the level shift transistor Ts.

Unlike the small-amplitude transmission circuit of the comparative example, the small-amplitude transmission circuit 40 of the present embodiment shown in FIG. 5 has a protection circuit 44 connected to the transmission line 42. Assume that the voltage of the transmission line 42 exceeds a predetermined to set voltage. In the above case, a current flows from the transmission line 42 through the protection circuit 44. By making the current flow from the transmission line 42, a rise in the voltage of the transmission line 42 is suppressed. By suppressing the rise in the voltage of the transmission line 42, it is possible to prevent the voltage applied to the element connected to the transmission line 42 from exceeding the breakdown voltage limit of the element.

Assume that the voltage of the transmission line 42 exceeds the set voltage. In the above case, a current flows from the transmission line 42 to the output terminal OUT through the protection circuit 44 and the voltage of the transmission line 42 is reduced. The set voltage is set such that the voltage applied to the element connected to the transmission line 42 does not exceed the breakdown voltage limit.

The protection circuit 44 includes an NMOS transistor as shown in FIG. 5, for example. One terminal (a drain, for example) and a gate of the NMOS transistor are connected to the transmission line 42. The other terminal (a source, for example) is connected to the output terminal OUT. One terminal of the NMOS transistor is connected to the gate. Due to this, suppose that the voltage difference between one terminal (a drain, for example) and the other terminal (a source, for example) is larger than the voltage corresponding to the threshold voltage Vth. In the above case, a current flows through the NMOS transistor. Alternatively, suppose that the voltage difference between one terminal (a drain, for example) and the other terminal (a source, for example) is smaller than the voltage corresponding to the threshold voltage Vth. In the above case, no current flows through the NMOS transistor. In this way, the NMOS transistor having one terminal (a drain, for example) connected to a gate functions as the diode D1. One terminal (a drain, for example) corresponds to an anode and the other terminal (a source, for example) corresponds to a cathode, for example. Further, the set voltage is higher than the voltage VDD supplied to the output terminal OUT by a voltage corresponding to the threshold voltage Vth of the NMOS transistor.

The protection circuit 44 may have a PN junction type diode D1 instead of having the NMOS transistor having one terminal (a drain, for example) connected to a gate. In this case, an anode of the diode D1 is connected to the transmission line 42 and a cathode is connected to the output terminal OUT. The voltage VDD is set to the output terminal OUT, for example. Therefore, in the small-amplitude transmission circuit 40 shown in FIG. 5, suppose that the voltage of the transmission line 42 rises to be higher than the sum of the voltage VDD and a forward voltage VF of the diode D1. In the above case, a current flows from the transmission line 42 to the output terminal OUT through the protection circuit 44. That is, the voltage of the transmission line 42 is suppressed from becoming higher than the sum of the voltage VDD and the forward voltage VF. Assume that the forward voltage VF of the diode D1 is 0.5 V and the voltage VDD is 2 V, for example. In the above case, the voltage of the transmission line 42 does not rise above 2.5 ✓. Therefore, according to the small-amplitude transmission circuit 40, it is possible to prevent the element connected to the transmission line 42 from being broken.

A diode that is not a PN junction type may be used for the protection circuit 44. The protection circuit 44 may be a Schottky barrier diode, for example.

As a method for suppressing the current consumption due to the propagation of the signal through the transmission line, instead of the method using the level shift transistor Ts as described above, the following methods are feasible: a method for reducing the wiring capacity by increasing the distance between the transmission lines, and a method for reducing the amplitude of the signal propagated through the transmission line by using a power supply for a small amplitude. However, the method of increasing the distance between transmission lines and the method of using the power supply for a small amplitude lead to an increase in the chip area of a semiconductor integrated circuit. Meanwhile, in the small-amplitude transmission circuit 40 according to the first embodiment, the amplitude of the signal propagating through the transmission line 42 is reduced by means of a simple configuration using only the level shift transistor Ts. This can suppress the chip area.

As described above, in the semiconductor integrated circuit according to the first embodiment, the current consumption of the transmission line 42 is suppressed by reducing the amplitude of the signal propagated through the transmission line 42. Furthermore, in the semiconductor integrated circuit according to the first embodiment, the protection circuit 44 suppresses the voltage of the transmission line 42 from becoming higher than a predetermined voltage. This can prevent the breakdown voltage damage of the element connected to the transmission line 42.

Figure 8:
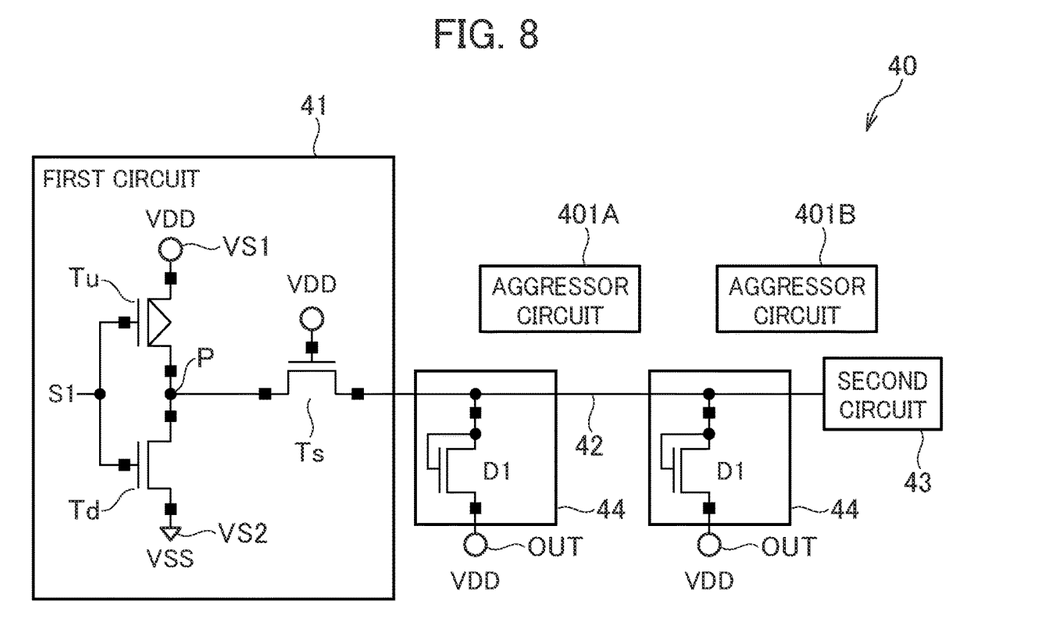
FIG. 8 is a schematic diagram showing another example of how an aggressor circuit is arranged.

The closer the region of the transmission line 42 is to the aggressor circuit, the greater the rise in voltage due to the influence of the aggressor circuit. Therefore, it is preferable that the protection circuit 44 is connected to a position close to the aggressor circuit in the periphery of the transmission line 42. By connecting the protection circuit 44 to a position close to the aggressor circuit in the periphery of the transmission line 42, influence due to the aggressor circuit can be more surely suppressed. The protection circuit 44 is connected to the position closest to the aggressor circuit in the periphery of the transmission line 42, for example. The protection circuit 44 is provided to a position closer to the aggressor circuit than another circuit. Further, if a plurality of aggressor circuits are present around the transmission line 42, protection circuits 44 may be connected to the transmission line 42 at positions close to the individual aggressor circuits. Suppose that a first aggressor circuit 401A and a second aggressor circuit 401B are arranged in the periphery of the transmission line 42 as shown in FIG. 8, for example. In the above case, protection circuits 44 may be connected to a position close to the first aggressor circuit 401A and a position close to the second aggressor circuit 401B individually.

However, the chip area increases if the number of the protection circuits 44 is increased. Therefore, the number of the protection circuits 44 may be set by considering a trade-off relationship between the influence of the aggressor circuits and the increase in the chip area. Alternatively, the protection circuit 44 may be connected to the transmission line 42 at a halfway position between two positions close to the two aggressor circuits.

Second Embodiment

Figure 9:
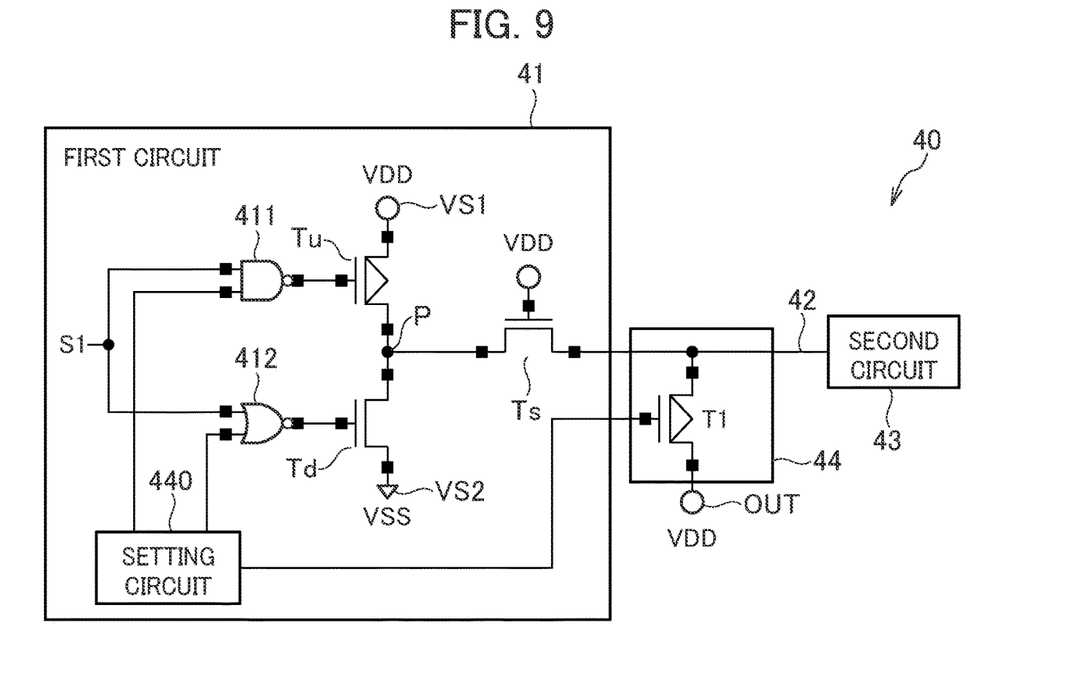
FIG. 9 is a circuit diagram showing a configuration of a semiconductor integrated circuit according to a second embodiment.

In a semiconductor integrated circuit according to a second embodiment, as shown in FIG. 9, the protection circuit 44 of the small-amplitude transmission circuit 40 includes a transistor in which the first main electrode connected to the transmission line 42 and the second main electrode set to a voltage lower than the set voltage. The protection circuit 44 shown in FIG. 9 differs from the protection circuit 44 of the first embodiment in that the protection circuit 44 shown in FIG. 9 has a PMOS transistor T1 instead of the diode D1 (an NMOS transistor having one terminal connected to a gate). The second main electrode of the PMOS transistor T1 is connected to an output terminal OUT. A setting circuit 440 of the small-amplitude transmission circuit 40 shown in FIG. 9 applies a predetermined voltage to a gate electrode of the PMOS transistor T1 depending on the state of the transmission line 42 as described below.

The transmission line 42 is susceptible to capacitive coupling when the transmission line 42 is in a floating state, which is a state in which a signal is not propagating through the transmission line 42. Hereinafter, the floating state in which the transmission line 42 is not used, that is, a state in which a signal is not propagated (the propagation of the signal through the transmission line 42 is inhibited) through the transmission line 42, is also referred to as a "stop state". When both a pull-up transistor Tu and a pull-down transistor Td are turned off, the transmission line 42 is in a stop state. Meanwhile, a state in which either one of the pull-up transistor Tu and the pull-down transistor Td is turned on and a signal is propagated through the transmission line 42 is hereinafter also referred to as a "transmission state". In order to turn off both the pull-up transistor Tu and the pull-down transistor Td and to bring the transmission line 42 into the floating state, it is preferable to use the first circuit 41 shown in FIG. 9 functioning as a tri-state buffer, for example.

The first circuit 41 shown in FIG. 9 has a NAND circuit 411 and a NOR circuit 412. Specifically, an output from the NAND circuit 411 is input to a gate electrode of the pull-up transistor Tu and an output from the NOR circuit 412 is input to a gate electrode of the pull-down transistor Td. A signal S1 is input to one input terminal of the NAND circuit 411 and one input terminal of the NOR circuit 412. The setting circuit 440 sets the voltage of a connection point P to any one of a high level, a low level, and a high impedance state by inputting a predetermined signal to the other input terminal of the NAND circuit 411 and the other input terminal of the NOR circuit 412.

The setting circuit 440 sets the PMOS transistor T1 to the OFF state when the transmission line 42 is in the transmission state. The voltage VDD is applied to the gate electrode of the PMOS transistor T1, for example. Meanwhile, the setting circuit 440 sets the PMOS transistor T1 to the ON state when the transmission line 42 is in the stop state. A voltage VSS is applied to the gate electrode of the PMOS transistor T1, for example. Suppose that the voltage of the transmission line 42 exceeds the set voltage due to the influence of the aggressor circuit 401 or the like when the transmission line 42 is in the transmission state. In the above case, a current flows from the transmission line 42 to a substrate via a back gate of the PMOS transistor T1.

In accordance with the semiconductor integrated circuit according to the second embodiment, a current flows from the transmission line 42 through the PMOS transistor T1. This can prevent the breakage of an element connected to the transmission line 42. Other features except the above of the second embodiment are substantially the same to those of the first embodiment, and redundant description is omitted.

Third Embodiment

Figure 10:
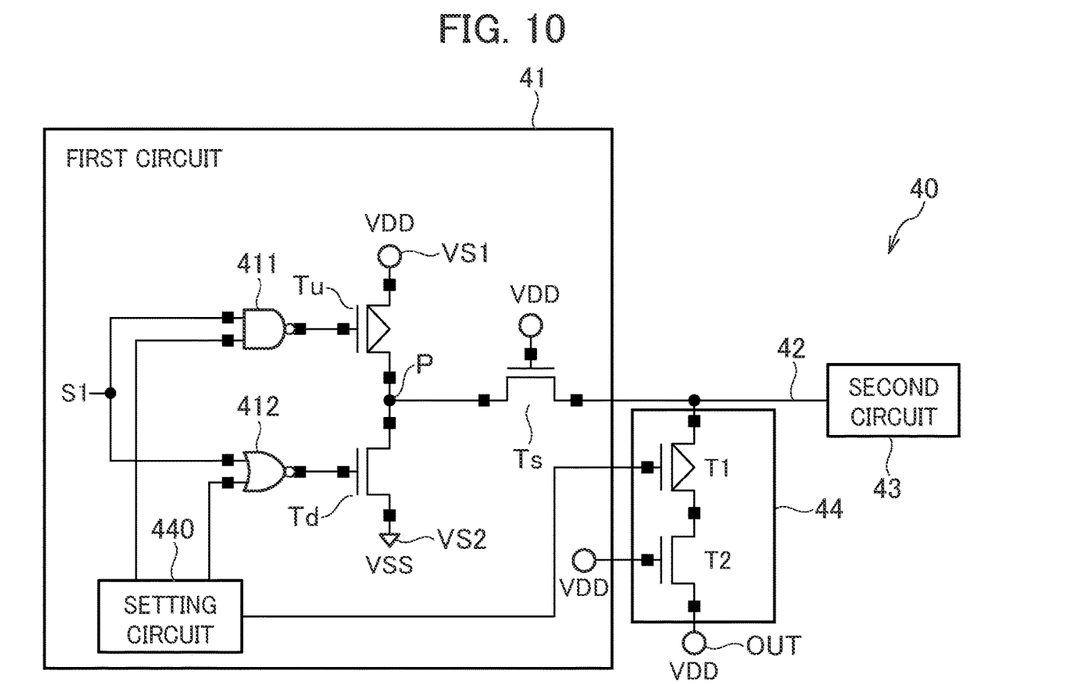
FIG. 10 is a circuit diagram showing a configuration of a semiconductor integrated circuit according to a third embodiment.

A semiconductor integrated circuit according to a third embodiment has a protection circuit 44 of a small-amplitude transmission circuit 40 which includes a cascade-connected PMOS transistor T1 and NMOS transistor T2 as shown in FIG. 10. One main electrode of the PMOS transistor T1 is connected to the transmission line 42. One main electrode of the NMOS transistor T2 is connected to the other main electrode of the PMOS transistor T1, and the other main electrode of the NMOS transistor T2 is connected to the output terminal OUT. The output terminal OUT is set to a voltage lower than a set voltage. The output terminal OUT shown in FIG. 10 is set to have the voltage VDD.

As in the small-amplitude transmission circuit 40 shown in FIG. 9, in the small-amplitude transmission circuit 40 shown in FIG. 10, the setting circuit 440 applies a predetermined voltage to the gate electrode of the PMOS transistor T1 depending on the state of the transmission line 42. When the transmission line 42 is in the transmission state, the voltage VDD is applied to the gate electrode of the PMOS transistor T1, for example. Meanwhile, when the transmission line 42 is in a stop state, a voltage VSS is applied to the gate electrode of the PMOS transistor T1. A voltage VDD is applied to the gate electrode of the NMOS transistor T2.

In accordance with the semiconductor integrated circuit according to the third embodiment, when the voltage of the transmission line 42 rises, a current flows from the transmission line 42 through the protection circuit 44. This can prevent breakage of an element connected to the transmission line 42. The small-amplitude transmission circuit 40 shown in FIG. 10 brings the transmission line 42 into a high impedance state when the transmission line 42 is a signal line through which a signal propagates bidirectionally (hereinafter also referred to as a "bidirectional signal line"). When the transmission line 42 is in a high impedance state, the occurrence of a current (a through current) flowing into the transmission line 42 from the first circuit 41 and the second circuit 43 is prevented.

Furthermore, according to the small-amplitude transmission circuit 40 shown in FIG. 10, when the transmission line 42 changes from the stop state to the transmission state, the time required until the transmission line 42 is set to a predetermined voltage from the floating state of the transmission line 42 can be shortened.

Figure 11A:
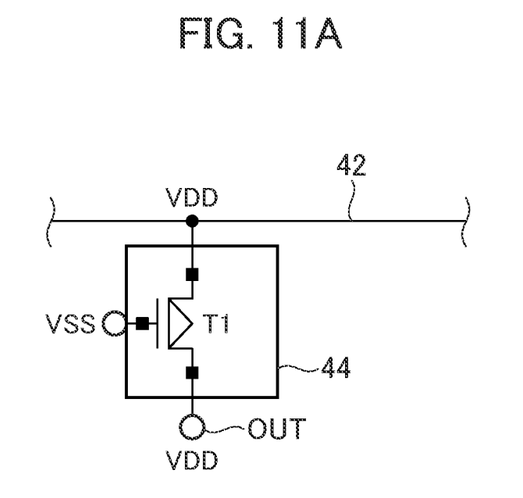
FIG. 11A is a schematic diagram for explaining an example of setting a voltage of a transmission line in a semiconductor integrated circuit shown in FIG. 9.
Figure 11B:
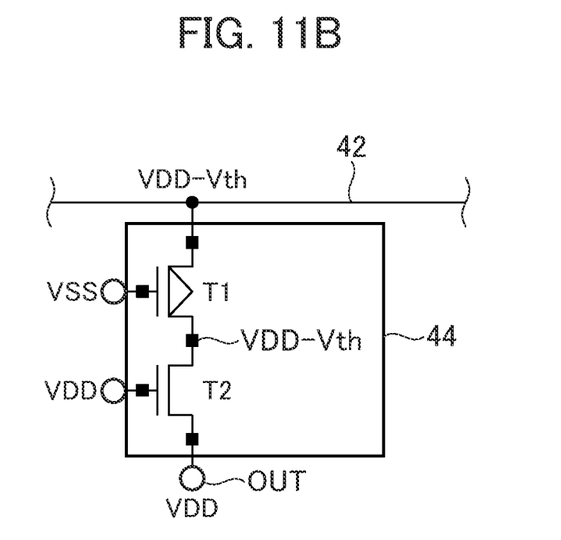
FIG. 11B is a schematic diagram for explaining an example of setting a voltage of a transmission line in a semiconductor integrated circuit shown in FIG. 10.

In the small-amplitude transmission circuit 40 shown in FIG. 9, the voltage of the transmission line 42 in the floating state is VDD as shown in FIG. 11A, for example. Therefore, in order to change the status of the voltage of the transmission line 42 from the floating state to the high level, a time required for changing the voltage of the transmission line 42 from VDD to VDD-Vth is necessary. Meanwhile, in the small-amplitude transmission circuit 40 shown in FIG. 10, the voltage at the connection point between the PMOS transistor T1 and the NMOS transistor T2 when the transmission line 42 is in the floating state is VDD-Vth as shown in FIG. 11B. Therefore, the voltage of the transmission line 42 is VDD-Vth. In other words, in the small-amplitude transmission circuit 40 shown in FIG. 10, the protection circuit 44 biases the voltage of the transmission line 42 by the threshold voltage Vth of the NMOS transistor T2. Therefore, the time required for changing the status of the voltage of the transmission line 42 from the floating state to the high level can be shortened. Further, the time required for changing the voltage of the transmission line 42 from VDD-Vth when the transmission line 42 is in the floating state to the low level VSS is shorter than the time required for changing the voltage of the transmission line 42 from VDD when the transmission line 42 is in the floating state to the low level VSS.

Fourth Embodiment

Figure 12:
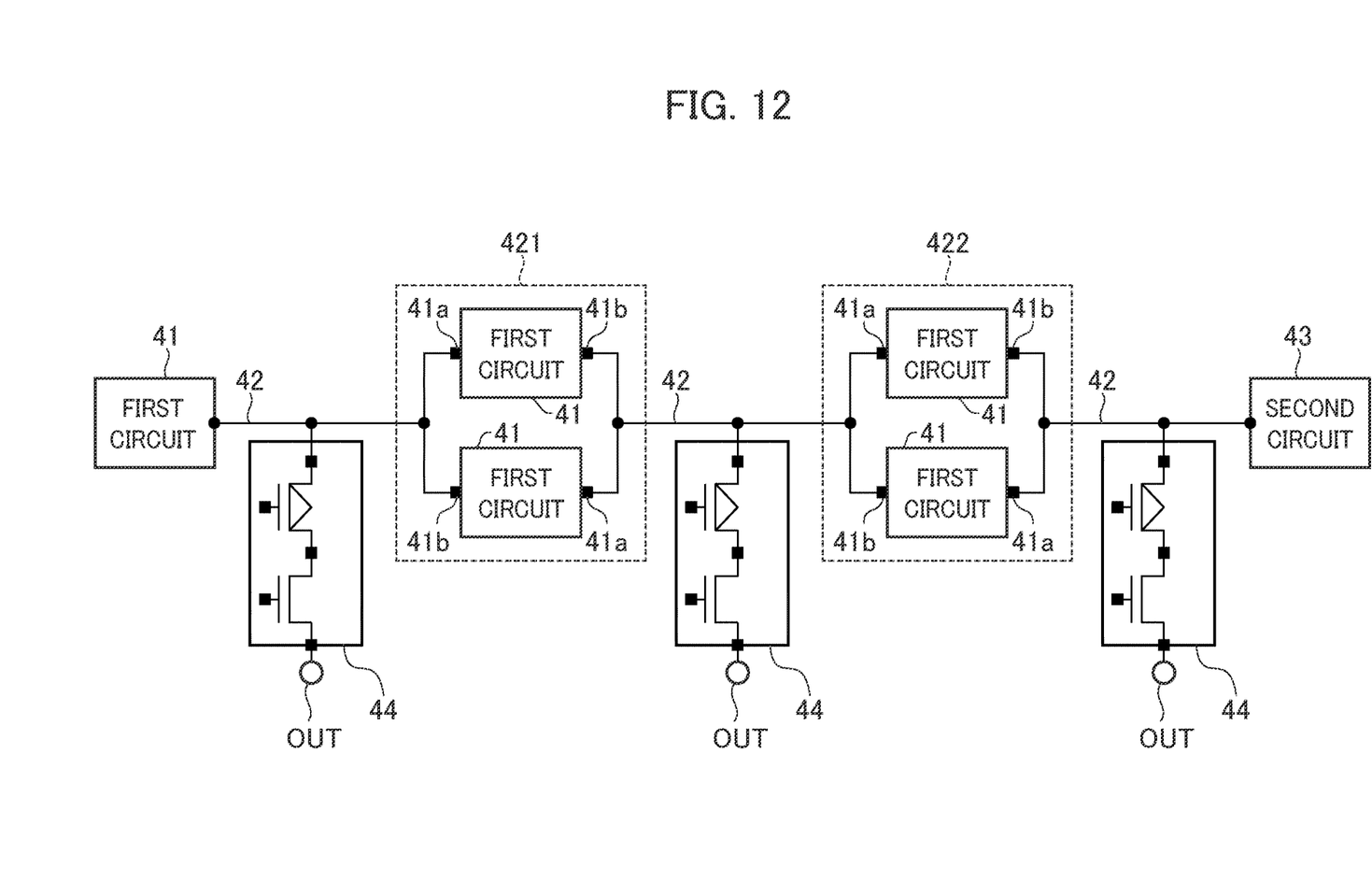
FIG. 12 is a circuit diagram showing a configuration of a semiconductor integrated circuit according to a fourth embodiment.

In a semiconductor integrated circuit according to a fourth embodiment, a transmission line 42 of a small-amplitude transmission circuit 40 is a bidirectional signal line as shown in FIG. 12. That is, a first circuit 41 may be a driver circuit and a second circuit 43 may be a receiver circuit, or alternatively the second circuit 43 may be a driver circuit and the first circuit 41 may be a receiver circuit. When the second circuit 43 is a driver circuit, the second circuit 43 outputs, to the transmission line 42, a signal as in the case where the first circuit 41 is a driver circuit. The signal has a voltage obtained by dropping a high level voltage from the voltage VDD of the power supply line VS1. The second circuit 43 may have a configuration similar to that of the first circuit 41 shown in FIG. 5, FIG. 9, or FIG. 11, for example.

A driver circuit and a receiver circuit for transmitting/receiving a signal included in the input-output circuit 22 shown in FIG. 4 correspond to the first circuit 41, for example. A driver circuit and a receiver circuit for transmitting/receiving a signal included in the data multiplexer 31C shown in FIG. 4 correspond to the second circuit 43. A signal line forming a data bus YIO through which a signal is transmitted shown in FIG. 4 corresponds to a transmission line 42. The protection circuit 44B shown in FIG. 4 corresponds to a protection circuit 44.

A first bidirectional circuit 421 and a second bidirectional circuit 422 are arranged between transmission lines 42 shown in FIG. 12. Protection circuits 44 are connected to transmission lines 42 between the first circuit 41 and the first bidirectional circuit 421, between the first bidirectional circuit 421 and the second bidirectional circuit 422, and between the second bidirectional circuit 422 and the second circuit 43 individually. The first bidirectional circuit 421 and the second bidirectional circuit 422 have a tri-state buffer for propagating a signal from the first circuit 41 to the second circuit 43 and a tri-state buffer for propagating a signal from the second circuit 43 to the first circuit 41. The first circuit 41 shown in FIG. or FIG. 9 may be used for the tri-state buffers of the first bidirectional circuit 421 and the second bidirectional circuit 422 as shown in FIG. 12, for example. In the first bidirectional circuit 421 and the second bidirectional circuit 422, a signal propagating through the transmission line 42 is input to an input terminal 41a of the first circuit 41, and is output from an output terminal 41b of the first circuit 41 to the transmission line 42.

Even when the transmission line 42 is a bidirectional signal line, if the transmission line 42 is set in a floating state, a voltage is easily affected by an aggressor circuit, for example. According to the small-amplitude transmission circuit 40 shown in FIG. 12, even if the transmission line 42 is affected by an aggressor circuit when the transmission line 42 is in the floating state, the protection circuit 44 can suppress breakdown voltage damage of an element connected to the transmission line 42.

Suppose that each of the first circuit 41 and the second circuit 43 has the combination of the NAND circuit 411, the NOR circuit 412, and the CMOS driver as shown in FIG. 10, for example. In the above case, the protection circuit 44 can also have the cascade-connected PMOS transistor T1 and NMOS transistor T2 shown in FIG. 10. As a result, as in the case of using the protection circuit 44 shown in FIG. 10, the time required until the transmission line 42 is set to have a predetermined voltage from the floating state of the transmission line 42 can be shortened.

While certain embodiments have been described, these embodiments have been presented by way of example only, and are not intended to limit the scope of the inventions. Indeed, the novel embodiments described herein may be embodied in a variety of other forms: furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a first power supply line to which a first voltage is supplied;
   a second power supply line to which a second voltage lower than the first voltage is supplied;
   a third power supply line to which a third voltage higher than the second voltage is supplied;
   a first circuit that is connected between the first power supply line and the second power supply line, includes a level shift transistor, and is configured to output a signal having an amplitude lower than the first voltage by a threshold voltage of the level shift transistor;
   a transmission line through which the signal output from the first circuit propagates;
   a second circuit connected the transmission line to receive the signal propagating through the transmission line; and
   a third circuit connected between the transmission line and the third power supply line and configured to allow a current to flow from the transmission line when a voltage of the transmission line exceeds a set voltage.

2. The semiconductor integrated circuit according to claim 1, wherein
   the first circuit is configured to output the signal by dropping the first voltage by the threshold voltage of the level shift transistor when a logical level of the signal is a high level.

3. The semiconductor integrated circuit according to claim 1, wherein
   the set voltage is higher than the third voltage.

4. The semiconductor integrated circuit according to claim 1, wherein
   the first circuit includes a CMOS driver that is connected between the first power supply line and the second power supply line; and
   the level shift transistor is connected between an output terminal of the CMOS driver and the transmission line.

5. The semiconductor integrated circuit according to claim 1, wherein
   the first voltage equals to the third voltage.

6. The semiconductor integrated circuit according to claim 5, wherein
   the third circuit includes a diode, an anode of the diode is connected to the transmission line, and a cathode of the diode is connected to the third power supply line.

7. The semiconductor integrated circuit according to claim 5, wherein
   the third circuit includes an n-channel type MOS transistor, one terminal and a gate of the n-channel type MOS transistor are connected to the transmission line, and another terminal of the n-channel type MOS transistor is connected to the third power supply line.

8. The semiconductor integrated circuit according to claim 5, wherein
   the third circuit includes a transistor that has a first main electrode connected to the transmission line and a second main electrode to which a voltage lower than the set voltage is set, and
   the transistor is set to an OFF state when propagation of the signal through the transmission line is allowed, and
   the transistor is set to an ON state when propagation of the signal through the transmission line is inhibited.

9. The semiconductor integrated circuit according to claim 8, wherein
   the first circuit includes a tri-state buffer switchable to allow or inhibit propagation of the signal through the transmission line.

10. The semiconductor integrated circuit according to claim 5, wherein
    the third circuit includes a p-channel type MOS transistor and an n-channel type MOS transistor that are cascade-connected,
    the p-channel type MOS transistor is set to an OFF state when propagation of the signal through the transmission line is allowed, and
    the p-channel type MOS transistor is set to an ON state when propagation of the signal through the transmission line is inhibited.

11. The semiconductor integrated circuit according to claim 1, wherein
    through the transmission line the signal propagates bidirectionally.

12. The semiconductor integrated circuit according to claim 11, further comprising:
    a nonvolatile memory configured to store data; and a sense amplifier configured to read out data from the nonvolatile memory and write data to the nonvolatile memory, wherein the transmission line includes a data bus that is connected to the sense amplifier and through which readout data read from the nonvolatile memory and write data written to the nonvolatile memory propagates.

13. The semiconductor integrated circuit according to claim 1, further comprising:

a nonvolatile memory configured to store data;

a sense amplifier configured to read out data from the nonvolatile memory and write data to the nonvolatile memory; and a fourth circuit configured to generate a clock signal, wherein the transmission line includes a clock line that extends from the fourth circuit to the sense amplifier and through which the clock signal propagates.

14. The semiconductor integrated circuit according to claim 13, wherein the nonvolatile memory is a NAND flash memory.

15. The semiconductor integrated circuit according to claim 1, further comprising:

a fifth circuit provided close to the transmission line to have a capacitive coupling therewith, wherein the third circuit is provided to a position closer to the fifth circuit than another circuit.

16. A semiconductor integrated circuit control method comprising:

outputting a signal having an amplitude lower than a first voltage by a threshold voltage of a level shift transistor, to a transmission line from a first circuit that is connected between a first power supply line to which the first voltage is supplied and a second power supply line to which a second voltage lower than the first voltage is supplied and includes the level shift transistor;

inputting, to a second circuit connected the transmission line, the signal propagating through the transmission line; and allowing a current to flow from the transmission line by means of a third circuit that is connected between the transmission line and a third power supply line to which a third voltage higher than the second voltage is supplied, when a voltage of the transmission line exceeds a set voltage.

17. The semiconductor integrated circuit control method according to claim 16, wherein the first voltage equals to the third voltage.

18. The semiconductor integrated circuit control method according to claim 17, wherein the third circuit includes a transistor that has a first main electrode connected to the transmission line and a second main electrode to which a voltage lower than the set voltage is set, the transistor is set to an OFF state when propagation of the signal through the transmission line is allowed, and the transistor is set to an ON state when propagation of the signal through the transmission line is inhibited.

19. The semiconductor integrated circuit control method according to claim 17, wherein the third circuit includes a p-channel type MOS transistor and an n-channel type MOS transistor that are cascade-connected, the p-channel type MOS transistor is set to an OFF state when propagation of the signal through the transmission line is allowed, and the p-channel type MOS transistor is set to an ON state when propagation of the signal through the transmission line is inhibited.

* * * * *